United States Patent [19]

Frederick

[11] Patent Number: 5,367,261
[45] Date of Patent: Nov. 22, 1994

[54] SHIELD FOR A MAGNETIC RESONANCE IMAGING COIL

[75] Inventor: Perry S. Frederick, Waukesha, Wis.

[73] Assignee: General Electric Company, Milwaukee, Wis.

[21] Appl. No.: 194,798

[22] Filed: Feb. 14, 1994

Related U.S. Application Data

[63] Continuation of Ser. No. 907,891, Jul. 2, 1992, abandoned.

[51] Int. Cl.⁵ .............................. G01R 33/28
[52] U.S. Cl. .................... 324/318; 324/322
[58] Field of Search ............ 324/318, 322, 300, 314, 324/320; 335/299, 301; 336/84 R, 84 C, 84 M

[56] References Cited

U.S. PATENT DOCUMENTS

| | | | |
|---|---|---|---|
| 4,680,548 | 7/1987 | Edelstein et al. | 324/318 |
| 4,692,705 | 9/1987 | Hayes | 324/318 |
| 4,694,255 | 9/1987 | Hayes | 324/318 |
| 4,694,663 | 9/1987 | Miller | 62/514 R |
| 4,712,067 | 12/1987 | Roschmann et al. | 324/318 |
| 4,771,256 | 2/1988 | Laskaris et al. | 335/301 |
| 4,871,969 | 10/1989 | Roemer et al. | 324/318 |
| 4,879,515 | 11/1989 | Roemer et al. | 324/322 |
| 4,952,877 | 8/1990 | Stormont et al. | 324/312 |
| 4,990,877 | 2/1991 | Benesch | 324/318 |
| 4,992,736 | 2/1991 | Stormont et al. | 324/309 |
| 5,017,872 | 5/1991 | Foo et al. | 324/322 |
| 5,132,621 | 7/1992 | Kang et al. | 324/318 |
| 5,243,286 | 9/1993 | Rzedzian et al. | 324/318 |

FOREIGN PATENT DOCUMENTS

| | | | |
|---|---|---|---|
| 0196511 | 10/1986 | European Pat. Off. | 335/301 |
| 9119994 | 12/1991 | WIPO | 324/318 |

Primary Examiner—Louis Arana
Assistant Examiner—Raymond Y. Mah
Attorney, Agent, or Firm—Quarles & Brady

[57] ABSTRACT

An NMR imaging apparatus includes an excitation coil with a plurality of conductive elements extending between two spaced-apart end loops to form conventional "birdcage" coil. A shield is provided to reduce interference between the excitation coil and gradient field coils. The shield comprises a first electrically conductive section having an open ring with a gap therein and a plurality of first members extending from the ring with each member terminating at a remote end. A capacitor is connected across the gap in the ring. A second electrically conductive section has another ring from which a like plurality of second members extend with each one terminating at a remote end. The remote end of each second member is spaced from a remote end of a corresponding one of the first members and a capacitor is connected across those remote ends.

15 Claims, 4 Drawing Sheets

SHIELD FOR A MAGNETIC RESONANCE IMAGING COIL

This application is a continuation of application Ser. No. 07/907,891 filed on Jul. 2, 1992 now abandoned.

BACKGROUND OF THE INVENTION

The field of the invention is nuclear magnetic resonance imaging systems; and more particularly, to coil assemblies employed in such systems to excite the nuclei and receive electrical signals produced by the nuclei.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant g of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but randomly oriented magnetic components in the perpendicular, or transverse, plane (X-Y plane) cancel one another. If the substance or tissue is subjected to a magnetic field (excitation field $B_1$) which is in the X-Y plane and which is near the Larmor frequency, the net aligned moment ($M_z$) may be rotated, or "tipped", into the X-Y plane to produce a net transverse magnetic moment $M_t$, which is rotating, or spinning, in the X-Y plane at the Larmor frequency. The practical value of this phenomenon resides in the electrical signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective X, Y and Z axes. The field gradients are produced by a trio of coils placed around the object being imaged. By controlling the strength of these gradients during each NMR cycle, the spatial distribution of spin excitation can be controlled and the location of the resulting NMR signals can be identified.

The excitation magnetic field, near the Larmor frequency in the radio frequency spectrum, is produced by a separate coil placed adjacent the area of interest in the object being imaged. If an image of substantially the entire object is desired a large radio frequency (RF) coil, often referred to as a "body coil" and extending around the entire object, is used to excite the spinning nuclei and receive the resultant electrical signals. In other situations when only a small portion of the object (such as the head of a medical patient) is to be imaged, a smaller radio frequency coil is placed about that portion of the object. The use of localized coils produce a more homogeneous excitation field within the desired portion.

One common type of radio frequency coil is cylindrical with a conductive loop at each end and axial conductive elements connecting the loops at periodic intervals around their circumference, as described in U.S. Pat. Nos. 4,680,548 and 4,692,705. The coil formed an endless loop transmission matrix that is excited by two signals in quadrature to produce a rotating electromagnetic excitation field within the coil. Because of its shape and appearance, this coil structure is sometimes referred as a "birdcage".

In a typical coil assembly, the radio frequency coil is located within the gradient coils with a relatively small spacing therebetween. The close physical proximity of these different coils results in a significant amount of the energy from the RF excitation field being lost due to impingement upon the gradient field coil structure. This loss shows up as a damping of the quality factor Q of the contained radio frequency coil which, in turn, degrades the normally attainable signal-to-noise ratio of the imaging device. Accordingly some type of RF shielding is usually placed between the radio frequency and gradient coils to preserve the Q of the former coil and consequently the signal-to-noise ratio of the system.

A solid copper shield has been proposed, however, gradient field induced eddy currents would be supported anywhere on such a structure. In addition, it is often desirable to be able to insert probes and other medical instruments through the coil assembly and into the patient being imaged which could not be done with a solid shield. Further in the case of localized RF coils for the patient's head, it is desirable to provide windows through which the patient can see to prevent a claustrophobic feeling during prolonged MRI scanning.

SUMMARY OF THE INVENTION

A radio frequency NMR coil has two electrically conductive end loops that are spaced from one another along a common central axis. The two end loops are interconnected by a plurality of axial elements that are spaced periodically around the two end loops.

The radio frequency NMR coil is protected by a shield from interference due to proximity to the gradient field coils. The shield has two end rings of electrically conductive material each of which is coaxial with a different one of the end loops of the coil. Each end ring is opened at a gap and a separate means creates a capacitance across the gaps in the first and second rings. A different set of electrically conductive members is connected to the each end ring extending toward the other end ring. The ends of the conductive members of one set are spaced from ends of the conductive members of the other set. Separate means creates a capacitance between ends of pairs conductive members consisting of a member connected to each ring.

An object of the present invention is to provide a mechanism that shields a radio frequency coil of an NMR imaging system from adversely interacting with the gradient coils in the system.

Another object of the present invention is to reduce the flow of eddy currents in such a shield.

A further object of the present invention is to provide an opening in the shield through medical instruments may be inserted and, in the case of a head coil shield, through which a patient being imaged can see.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
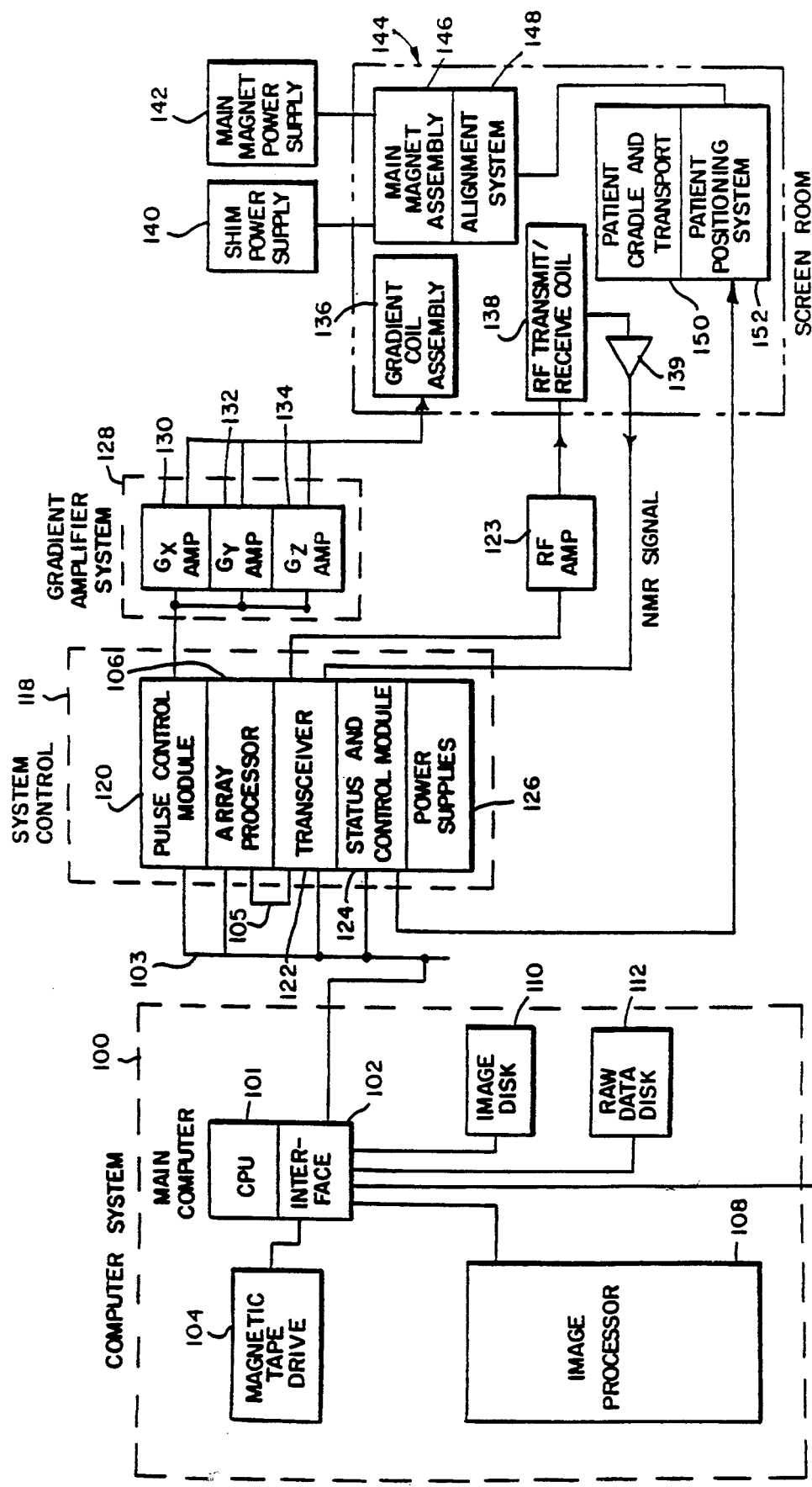
FIG. 1 is a block diagram of an NMR system which employs the present invention.

Referring initially to FIG. 1, there is shown in block diagram form the major components of an NMR system in which the present invention can be used and which is sold by the General Electric Company under the trademark "SIGNA". The overall operation of the system is under the control of a host computer system generally designated 100 which includes a main computer 101. Associated with the computer is an interface 102 through which a plurality of computer peripheral devices and other NMR system components are coupled. Among the computer peripheral devices is a magnetic tape drive 104 which under the direction of the main computer for archives patient data and images on tape. Processed patient data may also be stored in an image disc storage device designated 110. The image processor 108 provides interactive image display manipulation such as magnification, image comparison, gray scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console 116 also is used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprising $G_x$, $G_y$ and $G_z$ amplifiers 130, 132 and 134. Each amplifier 130, 132 and 134 excites a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X, Y and Z axis directions of a Cartesian coordinate system.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146 to produce the excitation field $B_1$. The NMR signals radiated by the excited nuclei in the patient are sensed by the RF coil and amplified by a preamplifier 139. The NMR signals are amplified, demodulated, filtered, and digitized in the receiver section of the transceiver 122. For a detailed description of the transceiver 122, reference is made to U.S. Pat. Nos. 4,952,877 and 4,992,736 which are incorporated herein by reference. The processed NMR signals are transmitted to the array processor 106 for processing by means of a dedicated, unidirectional link 105.

Referring still to FIG. 1, the PCM 120 and SCM 124 are independent subsystems both of which communicate with main computer 101, peripheral system, such as patient positioning system 152, as well as to one another by means of serial communications link 103. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF shielded room generally designated 144.

Figure 2:
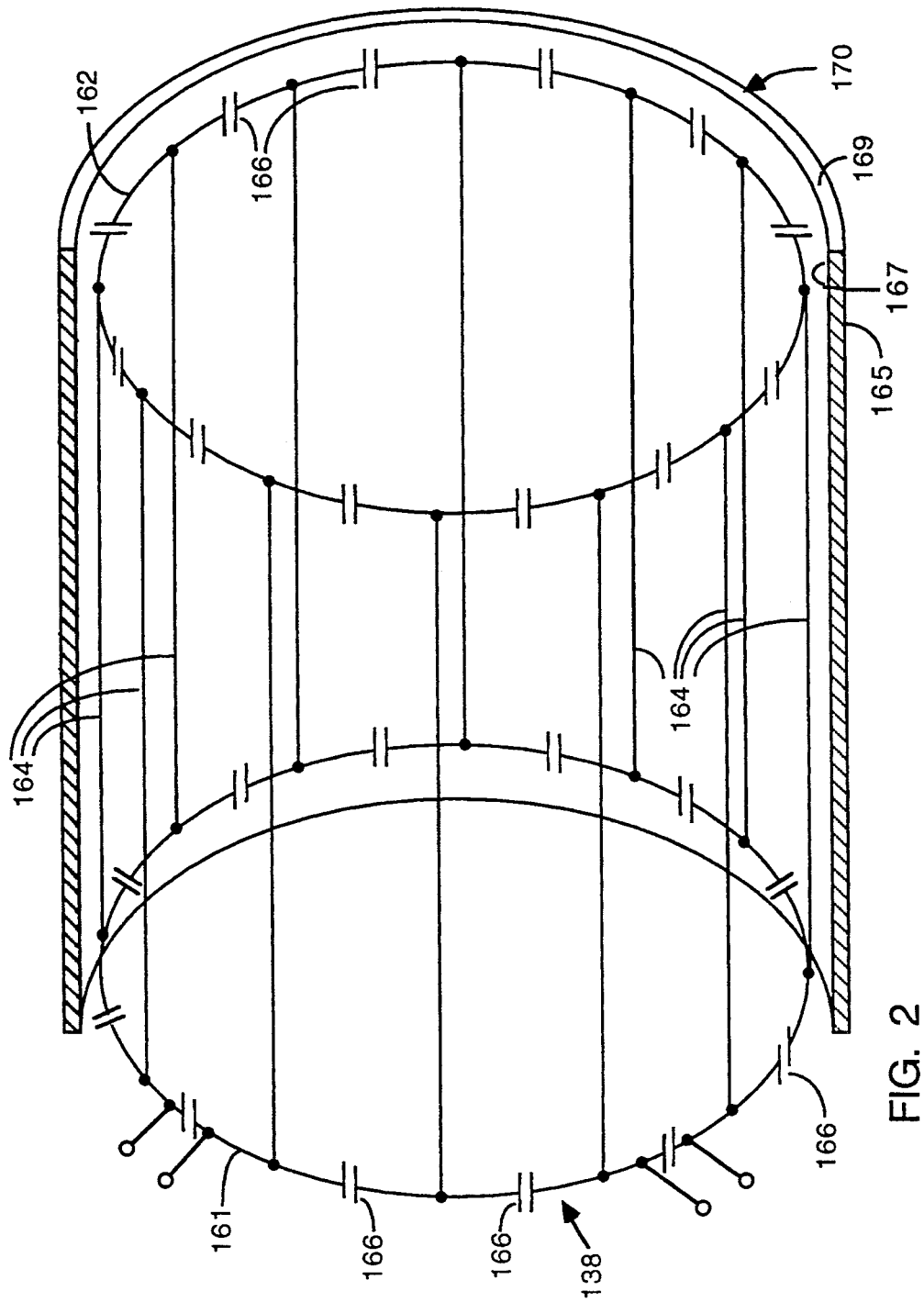
FIG. 2 is an schematic representation of a conventional "birdcage" type radio frequency coil for the NMR system with a shield therearound.

FIG. 2 illustrates a typical radio frequency coil 138 which has two electrically conductive end loops 161 and 162 spaced apart along a common central axis. These end loops may be circular, elliptical or another shape depending upon the desired geometry of the central opening of the RF coil in order to accommodate the part of the patient's body being imaged. Twelve conductive axial elements 164 interconnect the two end loops 161 and 162 at nodes to form a coil structure that resembles a cage, hence the name "birdcage" by which coils of this generic design are commonly referred. Capacitors 166 are located in segments of the two end loops 161 and 162 between the axial elements 164. The structure of the coil conductors defines a cylindrical imaging space within the RF coil. Although the exemplary field coil 138 has twelve axial elements 164, a greater or a lesser number of axial elements can be provided. The generic structure of the coil 138 in FIG. 2 can be adapted for use as a local or a full body coil.

Figure 3:
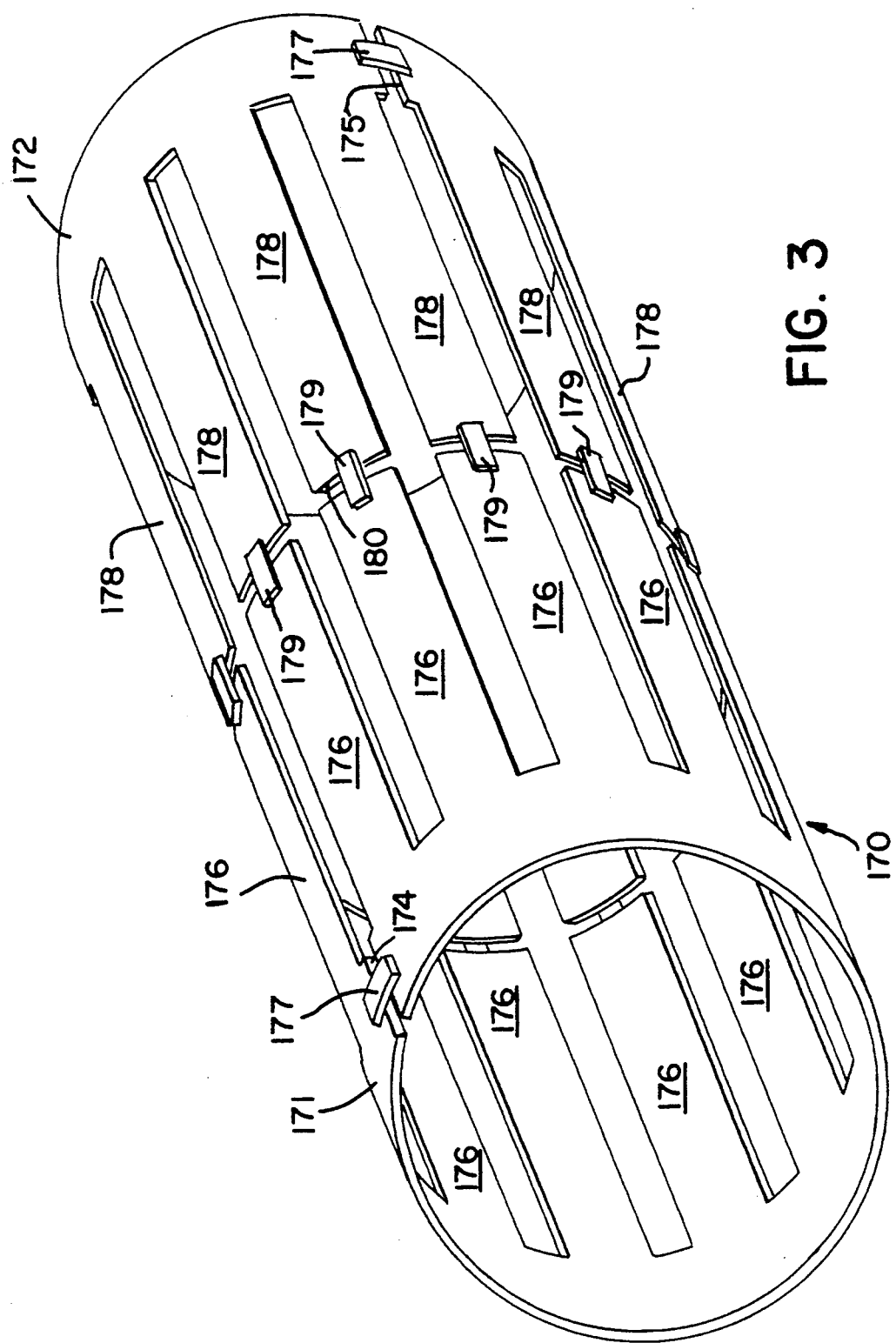
FIG. 3 is a pictorial view of an embodiment of a shield according to the present invention.

A tubular RF shield 170 is located coaxially around the RF coil 138. The detailed structure of an embodiment of the shield is shown in FIG. 3. The shield is fabricated from a sheet of a conductive material, such as copper which has been rolled into a cylindrical shape which corresponds to the shape of the RF coil 138. Preferably the shield is formed by applying a conductive layer in the illustrated pattern to a major surface of a tube 169 in FIG. 2.

The shield 170 has two end rings 171 and 172 each having a gap 174 and 175, respectively, located at one point around the circumference of each ring. Thus the rings are "open" and do not form a closed current path by themselves. The two gaps 174 and 175 are offset ninety degrees from each other around the circumference of the tubular shield. Twelve axial bars 176 and 178 extend inwardly from each of the end rings 171 and 172 in a manner such that the bars of one ring are aligned with the bars extending from the other end ring. Specifically, twelve axial bars 176 extend from the first end ring 171, while a similar number of axial bars 178 extend inwardly from the second end ring 172. Due to the isometric representation of the shield 170 in FIG. 3, only some of the axial bars 176 and 178 are visible. The remote ends of the first set of bars 176 are spaced slightly from the remote ends of the second set of bars 178 to create an annular gap 180 around the shield at substantially the mid-point along its length.

The RF shield 170 is constructed so that the two end rings 171 and 172 are centered over the end loops 161 and 162 of the RF coil. The shield is rotationally positioned so that the axial bars 176 and 178 are centrally positioned over the axial elements 164 of the RF coil 138. The width of each of the axial bars 176 and 178 is a function of the Larmor frequency and the distance between the RF and gradient coils. The width can be determined empirically by deriving the quality factor Q of the RF coil 138 and adjusting the dimensions of the bar elements to maximized the quality factor. For example, for an NMR head coil where the shield 170 is spaced 0.70 inches from the coil and the axial elements 164 of the coils are 0.30 inches wide, the axial bar 176 and 178 of the shield is 2.0 inches wide. Similarly, for a whole body coil that is spaced two inches from the shield and which has axial elements that are two inches wide, each axial bar 176 and 178 of the corresponding RF shield is 4.8 inches wide. These dimensions are intended only as examples and may vary depending upon the parameters, such as the Lamor frequency, used in a particular application of the present invention.

With continuing reference to FIG. 3, capacitors 177 are placed across the gaps 174 and 175 in the end rings 171 and 172 and another set of capacitors 179 are between aligned axial bars 176 and 178 across annular gap 180. The capacitors 177 and 179 have values chosen so as to conduct the relatively high frequency excitation signal that is applied to the RF coil 138 while blocking lower frequency eddy currents that are created in the shield 170 by the gradient electromagnetic fields.

As an alternative to using discrete capacitors bridging the gaps in the shield, the axial bars 176 and 178 could be extended to overlap one another with a sheet of dielectric material therebetween. This overlapping structure would provide capacitance between the two axial bars serving a similar function as the discrete capacitors 179 described above. A similar overlapping can be used at gaps 174 and 175 in the end rings 171 and 172.

During the operation of the NMR system, excitation of the gradient coil assembly 136 produces the three gradient fields $G_x$, $G_y$ and $G_z$ which penetrate the shield 170 throughout the imaging volume within the coil assembly. The open spaces between the fingers 176 and 178 further enable the gradient fields to penetrate the shield, In addition, as the shield in FIG. 3 is particularly adapted for use with a localized excitation coil that is worn about the head of a patient being imaged, the patient can see through the spacing between the longitudinal bars 176 and 178 thereby reducing the claustrophobic tendencies.

During the RF excitation mode of operation, when the RF signal is applied to the coil 138 within the shield 170, the shield, specifically the end rings 171 and 172 as well as the longitudinal bars 176 and 178, minimize the interaction of the resultant RF field with the gradient coil assemblies. Specifically, the shield prevents a loss of a significant portion of the RF field energy by preventing the impingement of that field on the large number of conductive loops found in the gradient coil assembly. Furthermore, the gaps 174, 175 and 180 as well as the spacing longitudinally between adjacent axial bars 176 and 178 serve to minimize any current flow within the shield 170.

Figure 4A:
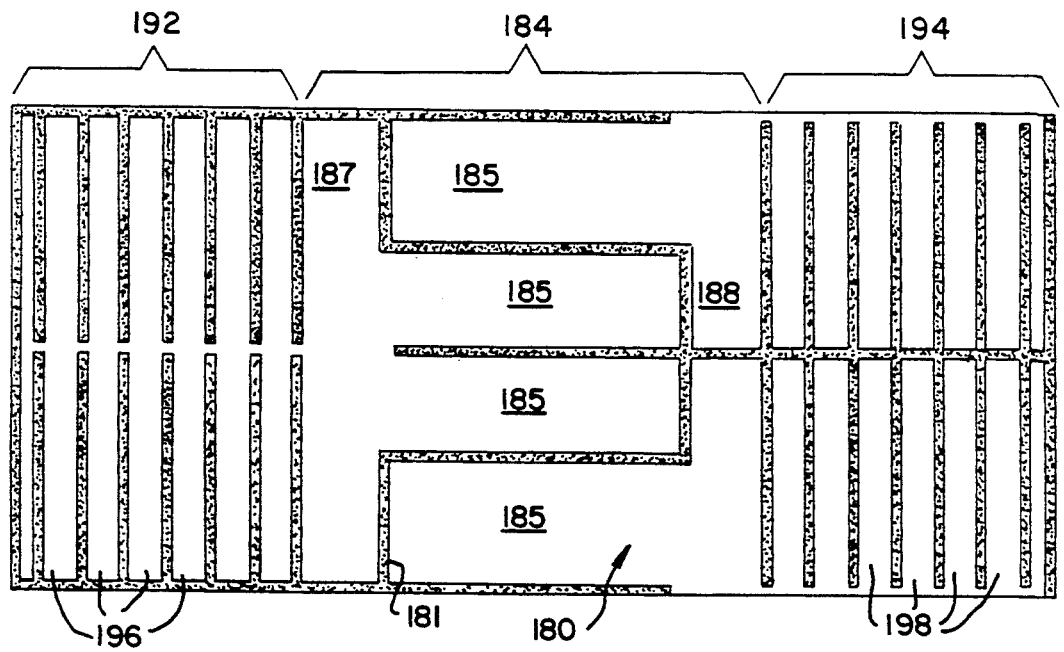
FIGS. 4A and 4B represent conductive patterns of another embodiment of a shield according to the present invention.
Figure 4B:
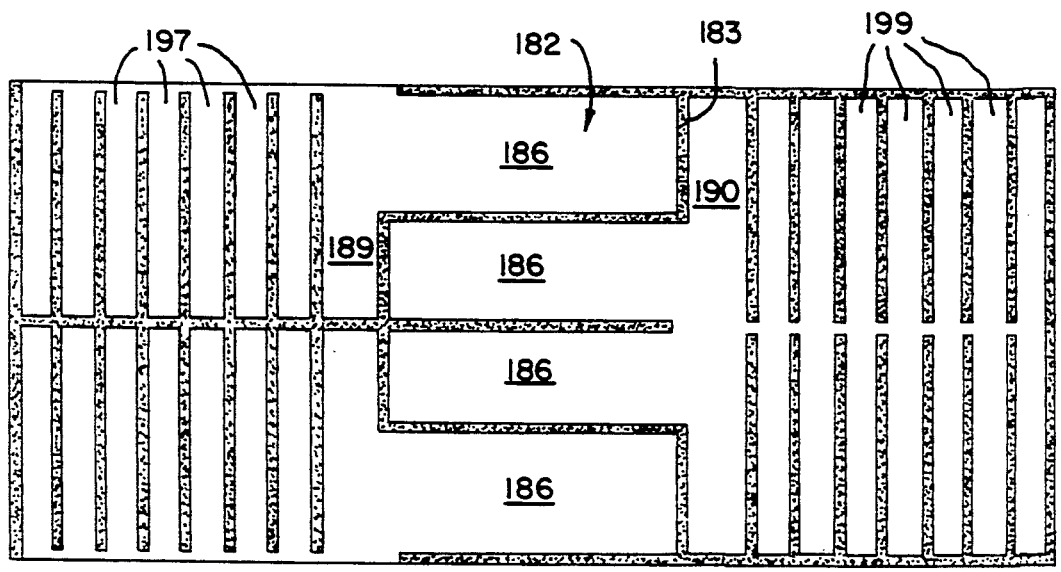

FIGS. 4A and 4B shows part of an alternative conductive pattern for a shield that is used with a full body coil that creates an excitation RF field within a volume that is large enough to contain the body of a patient being imaged. The RF coil is similar to that shown in FIG. 2 except that it has sixteen axial elements 164 as opposed twelve elements illustrated in the figure. The shield for a full body coil is fabricated by applying two conductive patterns 180 and 182 on opposite major surfaces 165 and 167 of a tube 169 formed of dielectric material. It should be noted that the two patterns in FIGS. 4A and 4B are mirror images of one another. The conductive patterns 180 and 182 shown in FIGS. 4A and 4B are applied to one-fourth of the surface of the dielectric tube and four such patterns are applied to the surfaces to form a complete shield. Abutting edges of conductive materials of each quadrant are electrically connected together such as by soldering. The pattern 180 illustrated in FIG. 4A is applied to the outer surface of the dielectric tube, whereas the conductive pattern 182 illustrated in FIG. 4B is applied to the opposite section of the inner surface of the dielectric tube. The patterns illustrated are as would be viewed by someone standing outside of the tube and looking therethrough.

That is, if a conductive pattern 182 in FIG. 4B was applied to the inner surface of a transparent tube, one would see that pattern when viewed from the outside. This representation indicates how the two conductive patterns overlap one another to form a shield with intrinsic capacitance between the various conductive elements. The stippled portions 181 and 183 in each of the figures represents the open spaces in the conductive patterns 180 and 182 through which the dielectric material is visible.

It will be appreciated by those skilled in the art that the excitation field generated by a body RF coil is significantly greater in magnitude than the excitation field generated by a local RF coil. Therefore, the degree of shielding required for a body RF coil is significantly greater than that provided by the shield in FIG. 3. A central region 184 of the shield patterns 180 and 182 has a plurality of interdigitated longitudinal bars 185 extending from two end rings 187 and 188 on the outer conductive pattern, and a similar set of bars 186 and end rings 189 and 190 on the inner pattern. The sixteen element body RF coil is positioned within a central region 184.

Although the body RF coil is only approximately 26 inches long, the intense electromagnetic fields extend far beyond the ends of the coil thereby requiring shielding beyond those ends as well. This shielding is provided by sections 192 and 194 of the conductive patterns 180 and 182. These sections comprise a plurality of circumferential fingers 196-199. The circumferential fingers 192 in pattern 180 are electrically connected along the center of the pattern, whereas fingers 194 are connected along the edge of the pattern.

As the two conductive patterns 180 and 182 are separated by the dielectric material of tube 171, a capacitance is formed which conductively links the two patterns at the high excitation frequency applied to the RF coil 138. Thus, discrete capacitors utilized with the structure in FIG. 3 are not required. The gaps or spaces formed by regions 181 and 183 effectively block the flow of eddy currents of significant magnitude in the shield.

The invention being claimed is:

1. A shield for a radio frequency NMR coil comprising:
    a tube made of dielectric material and having an inner curved surface and an outer curved surface;
    a first layer of electrically conductive material on the inner curved surface of said tube, and having a first and second conductive patterns that are noncontiguous with each other, wherein:
    the first conductive pattern forms a first ring extending around said tube with the first ring having first and second opposite sides, a first plurality of bars extending from the first side of and contiguous with the first ring, and
    the second conductive pattern forms a second ring extending around said tube with the second ring having first and second opposite sides, and a second plurality of bars extending from the first side of and contiguous with the second ring wherein bars of the second plurality of bars extend in-between bars in the first plurality of bars; and
    a second layer of electrically conductive material on the outer curved surface of said tube, and having third and fourth conductive patterns that are noncontiguous with each other, wherein:
    the third conductive pattern forms a third ring extending around said tube with the third ring having first and second opposite sides, a third plurality of bars extending from the first side of and contiguous with the third ring, and
    the fourth conductive pattern forms a fourth ring extending around said tube with the fourth ring having first and second opposite sides, and a fourth plurality of bars extending from the first side of and contiguous with the fourth ring, wherein bars of the fourth plurality of bars extend in-between bars in the third plurality of bars.

2. The shield as recited in claim 1 wherein bars of the first plurality of bars and the second plurality of bars are equidistantly spaced circumferentially around said tube.

3. The shield as recited in claim 1 wherein:
    said first conductive pattern further includes a first plurality of parallel fingers located adjacent to the second side of the first ring, and a longitudinal dimension of each one of the first plurality of parallel fingers extends circumferentially on the inner curved surface of said tube; and
    said second conductive pattern further includes a second plurality of parallel fingers adjacent to the second side of the second ring, and a longitudinal dimension of each one of the second plurality of parallel fingers extends circumferentially on the inner curved surface of said tube.

4. The shield as recited in claim 3 wherein:
    said third conductive pattern further includes a third plurality of parallel fingers adjacent to the second side of the third ring, and a longitudinal dimension of each one of the third plurality of parallel fingers extends circumferentially on the outer curved surface of said tube; and
    said fourth conductive pattern further includes a fourth plurality of parallel fingers adjacent to the second side of the fourth ring, and a longitudinal dimension of each one of the fourth plurality of parallel fingers extends circumferentially on the outer curved surface of said tube.

5. The shield as recited in claim 1 wherein:
    said third conductive pattern further includes a first plurality of parallel fingers connected to a side of the third ring which side is remote from the third plurality of bars, and a longitudinal dimension of each one of the first plurality of parallel fingers extends circumferentially on the outer curved surface of said tube; and
    said fourth conductive pattern further includes a second plurality of parallel fingers connected to a side of the fourth ring which side is remote from the fourth plurality of bars, and a longitudinal dimension of each one of the second plurality of parallel fingers extends circumferentially on the outer curved surface of said tube.

6. The shield as recited in claim 1 wherein:
    said first conductive pattern further includes a first plurality of fingers connected to a side of the first ring which side is remote from the first plurality of bars, and being organized into a plurality of first rows of parallel fingers with the first rows spaced circumferentially around said tube; and
    said second conductive pattern further includes a second plurality of fingers connected to a side of the second ring which side is remote from the second plurality of bars, and being organized into a plurality of second rows of parallel fingers with the second rows spaced circumferentially around said tube.

7. The shield as recited in claim 6 wherein:
said third conductive pattern further includes a third plurality of fingers connected to a side of the third ring which side is remote from the third plurality of bars, and being organized into a plurality of third rows of parallel fingers with the third rows spaced circumferentially around said tube; and
said fourth conductive pattern further includes a fourth plurality of fingers connected to a side of the fourth ring which side is remote from the fourth plurality of bars, and being organized into a plurality of fourth rows of parallel fingers with the fourth rows spaced circumferentially around said tube.

8. The shield as recited in claim 1 wherein the radio frequency NMR coil has a plurality of X axial elements where X is a positive integer; and wherein each of the first and second layers has exactly X bars.

9. The shield as recited in claim 1 wherein one of the first and second rings has a discontinuity; and one of the third and fourth rings has a discontinuity.

10. A shield for a radio frequency NMR coil comprising:
a tube made of dielectric material and having an inner curved surface and an outer curved surface;
a first layer of electrically conductive material on one of the inner and outer curved surfaces of said tube, and having a pattern which forms:
(a) first and second rings extending around said tube,
(b) a first plurality of bars extending from one side of the first ring and contiguous in said first layer only with the first ring,
(c) a second plurality of bars extending from one side of the second ring and contiguous in said first layer only with the second ring, wherein the second plurality of bars extends in-between the first plurality of bars,
(d) a first plurality of parallel fingers located on another side of the first ring with a longitudinal dimension of each one of the first plurality of parallel fingers extending circumferentially on the one of the inner and outer curved surfaces of said tube, and
(e) a second plurality of parallel fingers located on another side of the second ring with a longitudinal dimension of each one of the second plurality of parallel fingers extending circumferentially on the one of the inner and outer curved surfaces of said tube.

11. The shield as recited in claim 10 further comprising a second layer of electrically conductive material on another one of the inner and outer curved surfaces of said tube, and having a pattern which forms:
third and fourth rings extending around said tube,
a third plurality of bars extending from one side of the third ring and contiguous in said second layer only with the third ring,
a fourth plurality of bars extending from one side of the fourth ring and contiguous in said second layer only with the fourth ring, wherein the fourth plurality of bars extends in-between the third plurality of bars,
a third plurality of parallel fingers located on another side of the third ring with a longitudinal dimension of each one of the third plurality of parallel fingers extending circumferentially on the other of the inner and outer curved surfaces of said tube
a fourth plurality of parallel fingers located on another side of the fourth ring with a longitudinal dimension of each one of the third plurality of parallel fingers extending circumferentially on the other of the inner and outer curved surfaces of said tube.

12. A shield for a radio frequency NMR coil comprising:
a tube made of dielectric material and having an inner curved surface and an outer curved surface;
a first layer of electrically conductive material on the inner curved surface of said tube, and having a pattern which forms first and second rings extending around said tube with each ring having first and second opposite sides, a first plurality of pairs of bars extending from and contiguous in said first layer only with the first side of the first ring, and a second plurality of bars extending from and contiguous in said first layer only with the first side of the second ring with each pair of bars in the second plurality of pairs of bars extending in-between two different adjacent bars in the first plurality of pairs of bars; and
a second layer of electrically conductive material on the outer curved surface of said tube, and having a pattern which forms third and fourth rings extending around said tube with each of the third and fourth rings has first and second opposite sides, a third plurality of bars extending from and contiguous in said second layer only with the first side of the third ring, and a fourth plurality of bars extending from and contiguous in said second layer only with the first side of the fourth ring with each pair of bars in the fourth plurality of pairs of bars extending in-between two different adjacent bars in the third plurality of pairs of bars.

13. The shield as recited in claim 12 wherein bars of the first and second plurality of pairs bars are equidistantly spaced circumferentially around said tube.

14. The shield as recited in claim 12 wherein said first layer further includes:
a first plurality of parallel fingers located on a side of the first ring which side is remote from the second ring, and a longitudinal dimension of each one of the first plurality of parallel fingers extends circumferentially on the inner curved surface of said tube; and
a second plurality of parallel fingers located on a side of the second ring which side is remote from the first ring, and a longitudinal dimension of each one of the second plurality of parallel fingers extends circumferentially on the inner curved surface of said tube.

15. The shield as recited in claim 14 wherein said second layer further includes:
a third plurality of parallel fingers located on a side of the third ring which side is remote from the fourth ring, and a longitudinal dimension of each one of the third plurality of parallel fingers extends circumferentially on the outer curved surface of said tube; and
a fourth plurality of parallel fingers located on a side of the fourth ring which side is remote from the third ring, and a longitudinal dimension of each one of the fourth plurality of parallel fingers extends circumferentially on the outer curved surface of said tube.

* * * * *